(12) United States Patent
Takeda et al.

(10) Patent No.: US 10,634,836 B2
(45) Date of Patent: Apr. 28, 2020

(54) CIRCULAR POLARIZER FOR ORGANIC EL DISPLAY DEVICE HAVING LAMINATED HALF WAVELENGTH PLATE AND QUARTER WAVELENGTH PLATE, AND ORGANIC EL DISPLAY DEVICE

(71) Applicant: NITTO DENKO CORPORATION, Ibaraki-shi, Osaka (JP)

(72) Inventors: Kentarou Takeda, Ibaraki (JP); Hironori Yaginuma, Ibaraki (JP); Kazuki Uwada, Ibaraki (JP); Tadashi Kojima, Ibaraki (JP); Nao Murakami, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/307,688

(22) PCT Filed: Apr. 28, 2015

(86) PCT No.: PCT/JP2015/062752
§ 371 (c)(1),
(2) Date: Oct. 28, 2016

(87) PCT Pub. No.: WO2015/166930
PCT Pub. Date: Nov. 5, 2015

(65) Prior Publication Data
US 2017/0052300 A1    Feb. 23, 2017

(30) Foreign Application Priority Data

Apr. 30, 2014   (JP) ................................ 2014-093359

(51) Int. Cl.
*G02B 5/30*     (2006.01)
*H01L 51/52*    (2006.01)
(Continued)

(52) U.S. Cl.
CPC .............. *G02B 5/3083* (2013.01); *B32B 7/03* (2019.01); *B32B 7/06* (2013.01); *B32B 7/12* (2013.01);
(Continued)

(58) Field of Classification Search
CPC ...... G02B 5/30; G02B 5/3025; G02B 5/3033; G02B 5/3041; G02B 5/305; G02B 5/3083; H01L 51/5281; H01L 51/5293
(Continued)

(56) References Cited

U.S. PATENT DOCUMENTS 6,501,218 B1    12/2002  Duggal et al.
7,468,777 B2    12/2008  Kawamoto et al.
(Continued)

FOREIGN PATENT DOCUMENTS

CN         1721893 A      1/2006
CN       100405183 C      7/2008
(Continued)

OTHER PUBLICATIONS

English translation of Kawamoto et al., JP 2007-188033 A, retrieved on Sep. 22, 2017 from https://dossier1.j-platpat.inpit.go.jp/tri/all/odse/ODSE_GM101_Top.action.*
(Continued)

*Primary Examiner* — Ryan S Dunning
(74) *Attorney, Agent, or Firm* — Westerman, Hattori, Daniels & Adrian, LLP

(57) ABSTRACT

There is provided a circularly polarizing plate for an organic EL display apparatus that is excellent in productivity, is prevented from warping, and can achieve an excellent tint. An elongated circularly polarizing plate for an organic EL display apparatus according to an embodiment of the present invention includes in the following order: an elongated polarizer having an absorption axis in a longitudinal direc-
(Continued)

tion thereof; an elongated first retardation layer functioning as a λ/2 plate; and an elongated second retardation layer functioning as a λ/4 plate. An angle formed between the absorption axis of the elongated polarizer and a slow axis of the elongated first retardation layer is front 15° to 30°; and the absorption axis of the elongated polarizer and a slow axis of the elongated second retardation layer are substantially perpendicular to each other.

11 Claims, 2 Drawing Sheets

(51) Int. Cl.
| | |
|---|---|
| *B32B 27/00* | (2006.01) |
| *B32B 27/36* | (2006.01) |
| *B32B 27/30* | (2006.01) |
| *B32B 27/32* | (2006.01) |
| *B32B 7/03* | (2019.01) |
| *B32B 7/12* | (2006.01) |
| *B32B 27/08* | (2006.01) |
| *B32B 27/28* | (2006.01) |
| *B32B 7/06* | (2019.01) |
| *H05B 33/12* | (2006.01) |

(52) U.S. Cl.
CPC .............. *B32B 27/00* (2013.01); *B32B 27/08* (2013.01); *B32B 27/286* (2013.01); *B32B 27/302* (2013.01); *B32B 27/306* (2013.01); *B32B 27/308* (2013.01); *B32B 27/325* (2013.01); *B32B 27/36* (2013.01); *B32B 27/365* (2013.01); *G02B 5/30* (2013.01); *G02B 5/305* (2013.01); *H01L 51/5281* (2013.01); *B32B 2250/05* (2013.01); *B32B 2307/418* (2013.01); *B32B 2307/42* (2013.01); *B32B 2307/514* (2013.01); *B32B 2457/206* (2013.01); *H05B 33/12* (2013.01)

(58) Field of Classification Search
USPC .......................... 313/112; 359/483.01–494.01
See application file for complete search history.

(56) References Cited

U.S. PATENT DOCUMENTS

| | | |
|---|---|---|
| 9,081,144 B2 | 7/2015 | Cho et al. |
| 9,377,571 B2 | 6/2016 | Jeon et al. |
| 2004/0041968 A1 | 3/2004 | Otoshi et al. |
| 2006/0001799 A1 | 1/2006 | Kawamoto et al. |
| 2006/0203159 A1 | 9/2006 | Kawamoto et al. |
| 2007/0139773 A1 | 6/2007 | Kawamoto et al. |
| 2007/0222919 A1* | 9/2007 | Chiba .................. G02B 5/3025 349/96 |
| 2008/0252827 A1 | 10/2008 | Hirai et al. |
| 2009/0040434 A1 | 2/2009 | Kawamoto et al. |
| 2009/0296027 A1* | 12/2009 | Kawamoto ............. B32B 23/08 349/96 |
| 2012/0120356 A1* | 5/2012 | Washizu ............ C08G 64/0208 349/117 |
| 2013/0021667 A1* | 1/2013 | Tsuburaya .............. B32B 27/08 359/489.07 |
| 2013/0163081 A1 | 6/2013 | Cho et al. |
| 2014/0247487 A1 | 9/2014 | Jeon et al. |

FOREIGN PATENT DOCUMENTS

| | | |
|---|---|---|
| CN | 101285958 A | 10/2008 |
| CN | 103733095 A | 4/2014 |
| JM | 2007-328310 A | 12/2007 |
| JP | 2002-311239 A | 10/2002 |
| JP | 2002-372622 A | 12/2002 |
| JP | 2004-145282 A | 5/2004 |
| JP | 2006-178389 A | 7/2006 |
| JP | 2006-268006 A | 10/2006 |
| JP | 2006-268007 A | 10/2006 |
| JP | 2007-188033 A | 7/2007 |
| JP | 2009-134224 A | 6/2009 |
| JP | 2009-134277 A | 6/2009 |
| JP | 4449533 B2 | 4/2010 |
| JP | 2012-053079 A | 3/2012 |
| TW | 200801606 A | 1/2008 |
| TW | 201323945 A | 6/2013 |
| WO | 2014061215 A1 | 4/2014 |

OTHER PUBLICATIONS

International Search Report dated Jul. 21, 2015, issued in counterpart International Application PCT/JP2015/062752 (2 pages).
Office Action, dated Aug. 24, 2018, issued in counterpart Taiwanese Patent Application No. 104113985 (8 pages; w/ English translation).
Office Action, dated May 29, 2018, issued in counterpart Chinese Patent Application No. 201580022928.2 (20 pages; w/ English translation).
Office Action, dated Sep. 3, 2019, issued in counterpart Japanese Application No. 2018-188820 (12 pages; w/ English translation).
Office Action, dated Feb. 20, 2019, issued in counterpart Chinese Patent Application No. 201580022928.2 (21 pages; w/ English translation).
Office Action, dated Mar. 10, 2020, issued in counterpart Japanese Application No. 2018-188820 (11 pages; w/ English translation).

* cited by examiner

CIRCULAR POLARIZER FOR ORGANIC EL DISPLAY DEVICE HAVING LAMINATED HALF WAVELENGTH PLATE AND QUARTER WAVELENGTH PLATE, AND ORGANIC EL DISPLAY DEVICE

TECHNICAL FIELD

The present invention relates to a circularly polarizing plate for an organic EL display apparatus and an organic EL display apparatus.

BACKGROUND ART

In recent years, a display mounted with an organic EL panel has been proposed in association with widespread use of a thin display. The organic EL panel is liable to cause problems, such as ambient light reflection and background reflection, because the panel includes a metal layer having high reflectivity. In view of the foregoing, it has been known that those problems are prevented by arranging a circularly polarizing plate on a viewer side. A circularly polarizing plate obtained by laminating a polarizer, a $\lambda/2$ plate, and a $\lambda/4$ plate has been known as a general circularly polarizing plate (e.g., Patent Literatures 1 and 2). However, a conventional circularly polarizing plate involves the following problems. It is difficult to produce the plate by the so-called roll-to-roll process and hence the plate is poor in productivity, undesired warping occurs, and/or, when the plate is applied to an organic EL panel, an undesired tint occurs.

CITATION LIST

Patent Literature

[PTL 1] JP 2002-311239 A
[PTL 2] JP 2002-372622 A

SUMMARY OF INVENTION

Technical Problem

The present invention has been made to solve the above-mentioned conventional problems, and a primary object of the present invention is to provide a circularly polarizing plate for an organic EL display apparatus that is excellent in productivity, is prevented from warping, and can achieve an excellent tint.

Solution to Problem

An elongated circularly polarizing plate for an organic EL display apparatus according to an embodiment of the present invention includes in the following order: an elongated polarizer having an absorption axis in a longitudinal direction thereof; an elongated first retardation layer functioning as a $\lambda/2$ plate; and an elongated second retardation layer functioning as a $\lambda/4$ plate. An angle formed between the absorption axis of the elongated polarizer and a slow axis of the elongated first retardation layer is from 15° to 30°; and the absorption axis of the elongated polarizer and a slow axis of the elongated second retardation layer are substantially perpendicular to each other.

In one embodiment of the present invention, the elongated polarizer, the elongated first retardation layer, and the elongated second retardation layer are laminated by being continuously bonded to one another with their respective longitudinal directions aligned with one another while being conveyed in the longitudinal directions.

In one embodiment of the present invention, the elongated first retardation layer includes an obliquely stretched film of a cyclic olefin-based resin, an obliquely stretched film of a polycarbonate-based resin, or an alignment fixed layer of a liquid crystal compound; and the elongated second retardation layer includes a laterally stretched film of a cyclic olefin-based resin or a laterally stretched film of a polycarbonate-based resin.

In one embodiment of the present invention, the elongated circularly polarizing plate further includes, between the elongated polarizer and the elongated first retardation layer, between the elongated first retardation layer and the elongated second retardation layer, or on a side of the elongated second retardation layer opposite to the elongated first retardation layer, a third retardation layer having a refractive index ellipsoid of nz>nx=ny.

According to another aspect of the present invention, there is provided an organic EL display apparatus. The organic EL display apparatus includes the above-described elongated circularly polarizing plate for an organic EL display apparatus.

Advantageous Effects of Invention

According to the present invention, a polarizer and two specific retardation layers are laminated at specific axial angles, and hence the circularly polarizing plate for an organic EL display apparatus that is excellent in productivity, is prevented from warping, and can achieve an excellent tint can be obtained.

DESCRIPTION OF EMBODIMENTS

Hereinafter, embodiments of the present invention are described. However, the present invention is not limited to these embodiments.

Definitions of Terms and Symbols

The definitions of terms and symbols used herein are as follows.

(1) Refractive Indices (nx, ny, and nz)

A symbol "nx" represents a refractive index, in a direction in which an in-plane refractive index is maximum (that is, slow axis direction), "ny" represents a refractive index in a direction perpendicular to the slow axis in the plane (that is, fast axis direction), and "nz" represents a refractive index in a thickness direction.

(2) In-Plane Retardation (Re)

The term "Re($\lambda$)" refers to the in-plane retardation of a film measured at 23° C. with light having a wavelength of $\lambda$ nm. For example, the term "Re(550)" refers to the in-plane retardation of the film measured at 23° C. with light having a wavelength of 550 nm. The Re($\lambda$) is determined from the equation "Re=(nx−ny)×d" when the thickness of the film is represented by d (nm).

(3) Thickness Direction Retardation (Rth)

The term "Rth(λ)" refers to the thickness direction retardation of the film measured at 23° C. with light having a wavelength of λ nm. For example, the term "Rth(550)" refers to the thickness direction retardation of the film measured at 23° C. with light having a wavelength of 550 nm. The Rth(λ) is determined from the equation "Rth=(nx−nz)×d" when the thickness of the film is represented by d (nm).

(4) Nz Coefficient

An Nz coefficient is determined from the equation "Nz=Rth/Re".

(5) Perpendicular or Parallel

The expression "substantially perpendicular" includes a case where an angle formed by two optical axes is 90°±5.0°, preferably 90°±3.0°, more preferably 90°±1.0°. The expression "substantially parallel" includes a case where an angle formed by two optical axes is 0°±5.0°, preferably 0°±3.0°, more preferably 0°±1.0°.

A. Circularly Polarizing Plate

A-1. Entire Construction of Circularly Polarizing Plate

A circularly polarizing plate of the present invention is used in an organic EL display apparatus. The circularly polarizing plate of the present invention includes in the following order: an elongated polarizer having an absorption axis in its longitudinal direction; an elongated first retardation layer functioning as a λ/2 plate; and an elongated second retardation layer functioning as a λ/4 plate. That is, the circularly polarizing plate of the present invention is elongated. Hereinafter, the entire construction of the circularly polarizing plate is briefly described, and then the respective layers and optical films constituting the circularly polarizing plate are described in detail.

Figure 1:
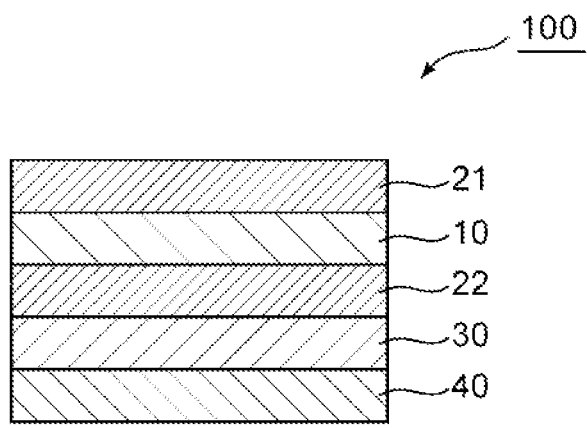
FIG. 1 is a schematic sectional view of a circularly polarizing plate according to one embodiment of the present invention.
Figure 2:
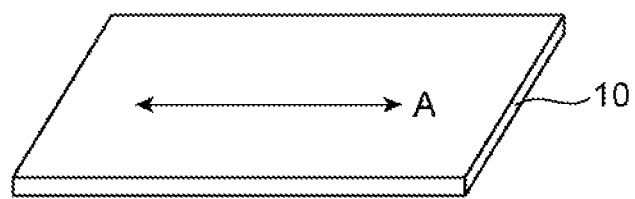
FIG. 2 is an exploded perspective view of a main portion of the circularly polarizing plate of FIG. 1.
Figure 2:
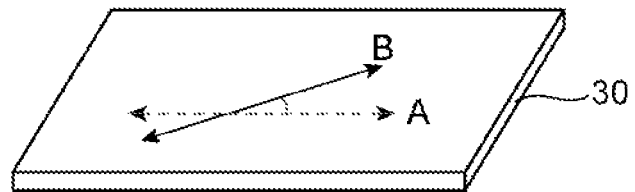
Figure 2:
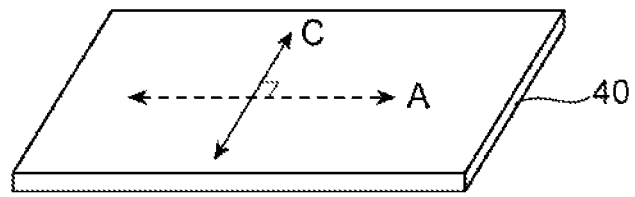

FIG. 1 is a schematic sectional view of a circularly polarizing plate according to one embodiment of the present invention, and FIG. 2 is an exploded perspective view of a main portion of the circularly polarizing plate of FIG. 1. A circularly polarizing plate 100 of this embodiment includes: a polarizer 10; a first protective film 21 arranged on one side of the polarizer 10; a second protective film 22 arranged on the other side of the polarizer 10; and a first retardation layer 30 and a second retardation layer 40 arranged on the side of the second protective film 22 opposite to the polarizer 10. That is, the circularly polarizing plate 100 includes in the following order: the polarizer 10, the first retardation layer 30, and the second retardation layer 40. As described above, the first retardation layer 30 functions as a λ/2 plate, and the second retardation layer 40 functions as a λ/4 plate. Although not apparent from the drawings, the circularly polarizing plate of the present invention is elongated as described above, and in one embodiment, the plate is wound in a roll shape.

The first retardation layer 30 can function as a protective film for the polarizer in some cases. Therefore, the second protective film 22 may be omitted depending on purposes and the like.

In the present invention, an angle formed between an absorption axis A of the polarizer 10 and a slow axis B of the first retardation layer 30 is from 15° to 30°, preferably from 20° to 25°, more preferably from 21.5° to 23.5°, particularly preferably about 22.5°. When the angle falls within such range, in a construction in which desired optical characteristics are obtained, a slow axis C of the second retardation layer can be made substantially perpendicular to the absorption axis A of the polarizer as illustrated in FIG. 2. Therefore, the slow axis of the second retardation layer can be set in its widthwise direction. As a result, the circularly polarizing plate can be produced by a roll-to-roll process, and hence extremely excellent productivity can be achieved. In addition, when the absorption axis A of the polarizer and the slow axis C of the second retardation layer are substantially perpendicular to each other, the warping of the circularly polarizing plate can be suppressed, and in the case where the circularly polarizing plate is applied to an organic EL display apparatus, an organic EL display apparatus excellent in tint can be achieved.

The circularly polarizing plate 100 may further include a third retardation layer having a refractive index ellipsoid of nz>nx=ny (not shown) as required. The position at which the third retardation layer is arranged may be set to any appropriate position depending on purposes. Specifically, the position at which the third retardation layer is arranged may be any one of the following positions: between the polarizer 10 and the first retardation layer 30, between the first retardation layer 30 and the second retardation layer 40, and on the side of the second retardation layer 40 opposite to the first retardation layer 30.

A-2. Polarizer

Any appropriate polarizer may be adopted as the polarizer 10. Specific examples thereof include: a product obtained by subjecting a hydrophilic polymer film such as a polyvinyl alcohol-based film, a partially formalized polyvinyl alcohol-based film, or an ethylene-vinyl acetate copolymer-based partially saponified film to dyeing treatment with a dichromatic substance such as iodine or a dichromatic dye and stretching treatment; and a polyene-based alignment film such as a dehydration-treated product of polyvinyl alcohol or a dehydrochlorination-treated product of polyvinyl chloride. Of those, a polarizer obtained by dyeing a polyvinyl alcohol-based film with iodine and uniaxially stretching the resultant is preferably used because of its excellent optical characteristics.

The dyeing with iodine is performed by, for example, immersing the polyvinyl alcohol-based film in an aqueous solution of iodine. The stretching ratio of the uniaxial stretching is preferably from 3 to 7 times. The stretching may foe performed after the dyeing treatment or may be performed simultaneously with the dyeing. In addition, the stretching may be performed before the dyeing. The polyvinyl alcohol-based film is subjected to, for example, swelling treatment, cross-linking treatment, washing treatment, or drying treatment as required. For example, when the polyvinyl alcohol-based film is washed with water by being immersed in water before the dyeing, the soil or antiblocking agent on the surface of the polyvinyl alcohol-based film can be washed off. In addition, the polyvinyl alcohol-based film can be swollen to prevent dyeing unevenness or the like.

The thickness of the polarizer is typically from about 1 μm to 80 μm.

A-3. First Retardation Layer

As described above, the first retardation layer 30 can function as a λ/2 plate. When the first retardation layer functions as a λ/2 plate, its retardation may be appropriately regulated for a wavelength dispersion characteristic after its lamination with the second retardation layer 40 functioning as a λ/4 plate (especially a wavelength range in which the retardation deviates from λ/4). The in-plane retardation Re(550) of such first retardation layer is from 220 nm to 320 nm, preferably from 240 nm to 300 nm, more preferably from 250 nm to 280 nm. The first retardation layer 30 typically has a refractive index ellipsoid of nx>ny=nz or nx>ny>nz. The Nz coefficient of the first retardation layer is, for example, from 0.9 to 1.3.

The thickness of the first retardation layer can be set so that the layer may most appropriately function as a λ/2 plate. In other words, the thickness can be set so that a desired in-plane retardation may be obtained. Specifically, the thickness is preferably from 1 μm to 80 μm. When the first retardation layer includes an obliquely stretched resin film, the thickness is more preferably from 10 μm to 60 μm, still more preferably from 30 μm to 50 μm. When the first retardation layer includes an alignment fixed layer of a liquid crystal compound, the thickness is more preferably from 1 μm to 10 μm, still more preferably from 2 μm to 8 μm.

The first retardation layer contains a resin having an absolute, value of a photoelastic coefficient of preferably $2\times10^{-11}$ m$^2$/N or less, more preferably from $2\times10^{-13}$ m$^2$/N to $1.5\times10^{-11}$ m$^2$/N, still more preferably from $1.0\times10^{-12}$ m$^2$/N to $1.2\times10^{-11}$ m$^2$/N. When the absolute value of the photoelastic coefficient falls within such range, in the case where a shrinkage stress at the time of the heating of the layer occurs, a change in retardation hardly occurs. Therefore, when the first retardation layer is formed by using a resin having such absolute value of a photoelastic coefficient, the heat unevenness of an organic EL display apparatus to be obtained can be satisfactorily prevented. Further, in the present invention, in conjunction with the fact that the second retardation layer to be described later also has a small absolute value of a photoelastic coefficient, the cracking of the circularly polarizing plate can be significantly prevented. As a result, the circularly polarizing plate of the present invention can be suitably used in an extremely thin organic EL display apparatus and/or a bendable organic EL display apparatus.

The first retardation layer may show a reverse wavelength dispersion characteristic, i.e., a retardation value increasing with an increase in wavelength of measurement light, may show a positive wavelength dispersion characteristic, i.e., a retardation value decreasing with an increase in wavelength of measurement light, or may show a flat wavelength dispersion characteristic, i.e., a retardation value hardly changing even when the wavelength of measurement light changes. The layer preferably shows a flat wavelength dispersion characteristic. Specifically, the first retardation layer preferably has a ratio Re(450)/Re(550) of from 0.39 to 1.03, and preferably has a ratio Re(650)/Re(550) of from 0.98 to 1.02. When the λ/2 plate (first retardation layer) and the λ/4 plate (second retardation layer) each having a flat wavelength dispersion characteristic are arranged at a predetermined axial angle, a characteristic close to an ideal reverse wavelength dispersion characteristic can be obtained, and as a result, an extremely excellent antireflection characteristic can be achieved. For example, a laminate of the first retardation layer (whose slow axis is in a 22.5° direction with regard to its longitudinal direction) and the second retardation layer to be described later (whose slow axis is in a 90° direction with regard to its longitudinal direction) preferably has a ratio Re(450)/Re(550) of from 0.86 to 0.96, and preferably has a ratio Re(650)/Re(550) of from 1.03 to 1.10.

In one embodiment, the first retardation layer may include any appropriate resin film that can satisfy such optical characteristics and mechanical characteristics as described above. Typical examples of such resin include a cyclic olefin-based resin and a polycarbonate-based resin.

The cyclic olefin-based resin is a general term for a resin prepared through polymerization of a cyclic olefin as a monomer, and examples thereof include resins described in JP 1-240517 A, JP 3-14882 A, JP 3-122137 A, and the like.

Specific examples thereof include: a ring opened (co)polymer of a cyclic olefin; an addition polymer of a cyclic olefin; a copolymer (typically, a random copolymer) of a cyclic olefin, and an α-olefin such as ethylene or propylene; their graft modified products each modified with an unsaturated carboxylic acid or its derivative; and hydrides thereof. A specific example of the cyclic olefin includes a norbornene-based monomer. Examples of the norbornene-based monomer include: norbornene, its alkyl substitution and/or alkylidene substitution such as 5-metyl-2-norbornene, 5-dimethyl-2-norbornene, 5-ethyl-2-norbornene, 5-butyl-2-norbornene, 5-ethylidene-2-norbornene, and their products each substituted by a polar group such as halogen; dicyclopentadiene and 2,3-dihydrodicyclopentadiene; dimethano octahydronaphtalene, its alkyl substitution and/or alkylidene substitution, and their products each substituted by a polar group such as halogen, for example, 6-methyl-1,4:5,8-dimethano-1,4,4a,5,6,7,8,8a-octahydronaphtalene, 6-ethyl-1,4:5, 8-dimethano-1,4,4a,5,6,7,8,8a-octahydronaphtalene, 6-ethylidene-1,4:5,8-dimethano-1,4,4a,5,6,7,8,8a-octahydronaphtalene, 6-chloro-1,4:5,8-dimethano-1,4,4a,5,6,7,8,8a-octahydronaphtalene, 6-cyano-1,4:5,8-dimethano-1,4,4a,5,6,7, 8,8a-octahydronaphtalene 6-pyridyl-1,4:5,8-dimethano-1,4, 4a,5,6,7,8,8a-octahydronaphtalene, and 6-methoxycarbonyl-1,4:5,8-dimethano-1,4,4a,5,6,7,8,8a-octahydronaphtalene; and a trimer of cyclopentadiene and a tetramer of cyclopentadiene, for example, 4,9:5,8-dimethano-3a,4,4a,5,8,8a,9,9a-octahydro-1H-benzoindene and 4,11:5,10:6,9-trimethano-3a,4,4a,5,5a,6,9,9a,10,10a,11,11-dodecahydro-1H-cyclopentaanthracene.

In the present invention, other ring-opening polymerizabie cycloolefins can be combined without impairing the purpose of the present invention. Specific example of such cycloolefin includes a compound having one reactive double-bond, for example, cyclopentene, cyclooctene, and 5,6-dihydrodicyclopentadiene.

The cyclic olefin-based resin has a number average molecular weight (Mn) of preferably 25,000 to 200,000, more preferably 30,000 to 100,000, and most preferably 40,000 to 80,000 measured through a gel permeation chromatography (GPC) method by using a toluene solvent. A number average molecular weight within the above ranges can provide a resin having excellent mechanical strength, and favorable solubility, forming property, and casting operability.

In the case where the cyclic olefin-based resin is prepared through hydrogenation of a ring opened polymer of a norbornene-based monomer, a hydrogenation rate is preferably 90% or more, more preferably 95% or more, and most preferably 99% or more. A hydrogenation rate within the above ranges can provide excellent heat degradation resistance, light degradation resistance, and the like.

For the cyclic olefin-based resin, various products are commercially available. Specific examples of the resin Include the trade names "ZEONEX" and "ZEONOR" each manufactured by ZEON CORPORATION, the trade name "Arton" manufactured by JSR Corporation, the trade name "TOPAS" manufactured by TICONA Corporation, and the trade name "APEL" manufactured by Mitsui Chemicals, Inc.

The polycarbonate-based resin is a polymer having a structure in which constituent units each derived from a dihydroxy compound are linked to each other through a carbonate bond, and is, for example, a resin described in JP 2014-44394A. A commercially available film may be used as a polycarbonate-based resin film. Specific examples of the commercially available product include products available under the trade names "PURE-ACE WR-S", "PURE-ACE WR-W", and "PURE-ACE WR-M" from Teijin Limited, and a product available under the trade name "NRF" from Nitto Denko Corporation.

The first retardation layer 30 is obtained by, for example, stretching a film formed from the cyclic olefin-based resin or the polycarbonate-based resin. Any appropriate forming method may be adopted as a method of forming a film from the cyclic olefin-based resin or the polycarbonate-based resin. Specific examples thereof include a compression molding method, a transfer molding method, an injection molding method, an extrusion method, a blowing method, a powder forming method, a FRP molding method, a cast coating method (such as a casting method), a calendar method, and a hot-press method. Of those, an extrusion method or a cast coating method is preferred. This is because the extrusion method or the cast coating method can increase the smoothness of the film to be obtained and provide satisfactory optical uniformity. Forming conditions may be appropriately set depending on, for example, the composition and kind of the resin to be used, and the desired characteristics of the first retardation layer. Many film products are commercially available as the cyclic olefin-based resin and the polycarbonate-based resin, and hence any one of the commercial films may be subjected as it is to a stretching treatment.

The first retardation layer is preferably produced by obliquely stretching the elongated resin film in a direction at a predetermined angle with regard to its longitudinal direction in a continuous manner. When the oblique stretching is adopted, an elongated stretched film having a predetermined alignment angle with regard to the longitudinal direction of the film (i.e., having a slow axis in a direction at the angle) is obtained. As a result, for example, a roll-to-roll process can be performed at the time of its lamination with the polarizer, and hence a production process can be simplified. The predetermined angle can be an angle formed between the absorption axis (longitudinal direction) of the polarizer and the slow axis of the first retardation layer.

As a stretching machine to be used, for the oblique stretching, for example, there is given a tenter stretching machine capable of applying feeding forces, or tensile forces or take-up forces, having different speeds on left and right sides in a lateral direction and/or a longitudinal direction. Examples of the tenter stretching machine include a lateral uniaxial stretching machine and a simultaneous biaxial stretching machine, and any appropriate stretching machine may be used as long as the elongated resin film can be continuously subjected to the oblique stretching.

Through appropriate control of each of the speeds on the left and right sides in the stretching machine, a first retardation layer having the desired in-plane retardation and having a slow axis in the desired direction can be obtained.

The stretching temperature of the film may be changed depending on, for example, the desired in-plane retardation value and thickness of the first retardation layer, the kind of the resin to be used, the thickness of the film to be used, and a stretching ratio. Specifically, the stretching temperature is preferably from Tg−30° C. to Tg+30° C., more preferably from Tg−15° C. to Tg+15° C., most preferably from Tg−10° C. to Tg+10° C. When the film is stretched at such temperature, a first retardation layer having an in-plane retardation by which the effects of the present invention can be appropriately exhibited can be obtained. Tg refers to the glass transition temperature of the material constituting the film.

In another embodiment, the first retardation layer may be an alignment fixed layer of a liquid crystal compound. When the liquid crystal compound is used, the difference between nx and ny of the retardation layer to be obtained can be markedly increased as compared to a non-liquid crystal material, and hence the thickness of the retardation layer required for obtaining a desired in-plane retardation can be markedly reduced. As a result, further thinning of the circularly polarizing plate (ultimately, the organic EL display apparatus) can be realized. The term "alignment fixed layer" as used herein refers to a layer in which the liquid crystal compound is aligned in a predetermined direction and its alignment state is fixed. In this embodiment, a rod-shaped liquid crystal compound is typically aligned in a state of being aligned in the slow axis direction of the first retardation layer (homogeneous alignment), An example of the liquid crystal compound is a liquid crystal compound whose liquid crystal phase is a nematic phase (nematic liquid crystal). As such liquid crystal compound, for example, a liquid crystal polymer or a liquid crystal monomer may be used. The expression mechanism of the liquid crystallinity of the liquid crystal compound may be lyotropic or thermotropic. The liquid crystal polymer and the liquid crystal monomer may each be used alone, or may be used in combination.

When the liquid crystal compound is the liquid crystal monomer, the liquid crystal monomer is preferably a polymerizable monomer or a cross-linkable monomer. This is because the alignment state of the liquid crystal monomer can be fixed by polymerizing or cross-linking (that is, curing) the liquid crystal monomer. After the alignment of the liquid crystal monomer, for example, when molecules of the liquid crystal monomer are polymerized or cross-linked with each other, the alignment state can be fixed as a result. In this case, a polymer is formed through the polymerization and a three-dimensional network structure is formed through the cross-linking, and the polymer and the structure are non-liquid crystalline. Therefore, the formed first retardation layer does not undergo, for example, a transition caused by a temperature change to a liquid crystal phase, a glass phase, or a crystal phase, which is peculiar to a liquid crystalline compound. As a result, the first retardation layer becomes a retardation layer which is extremely excellent in stability without being affected by a temperature change.

The temperature range in which the liquid crystal monomer shows liquid crystallinity varies depending on its kind. Specifically, the temperature range is preferably from 4° C. to 120° C., more preferably from 50° C. to 100° C., most preferably from 60° C. to 90° C.

Any appropriate liquid crystal monomer may be adopted as the liquid crystal monomer. For example, a polymerizable mesogenic compound and the like disclosed in Japanese Patent Translation Publication No. 2002-533742 (WO 00/37585), EP 358208 (U.S. Pat. No. 5,211,877), EP 66137 (U.S. Pat. No. 4,388,453), WO 93/22397, EP 0261712, DE 19504224, DE 4408171, GB 2280445, and the like may be used. Specific examples of such polymerizable mesogenic compound include a product available under the trade name LC242 from BASF SE, a product available under the trade name E7 from Merck KGaA, and a product available under the trade name LC-Sillicon-CC3767 from Wacker Chemie AG. The liquid crystal monomer is preferably, for example, a nematic liquid crystal monomer.

The alignment fixed layer of a liquid crystal compound may be formed by: subjecting the surface of a predetermined base material to alignment treatment; applying an application liquid containing a liquid crystal compound onto the surface; aligning the liquid crystal compound in a direction corresponding to the alignment treatment; and fixing the alignment state. In one embodiment, the base material is any appropriate resin film, and the alignment fixed layer formed on the base material may be transferred onto the surface of the second protective film 22 or the second retardation layer. In another embodiment, the base material may be the second protective film 22 or the second retardation layer. In this case, the transfer step is omitted, lamination can be performed by a roll-to-roll process continuously from the formation of the alignment fixed layer (first retardation layer), and hence productivity is further improved.

As the alignment treatment, any appropriate alignment treatment may be adopted. Specific examples thereof include mechanical alignment treatment, physical alignment treatment, and chemical alignment treatment. Specific examples of the mechanical alignment treatment include rubbing treatment and stretching treatment. Specific examples of the physical alignment treatment include magnetic field alignment treatment and electric field alignment treatment. Specific examples of the chemical alignment treatment include an oblique deposition method and photo alignment treatment. Any appropriate conditions may be adopted as treatment conditions for the various alignment treatments depending on purposes.

The alignment of the liquid crystal compound is performed through treatment at a temperature at which the liquid crystal compound shows a liquid crystal phase depending on the kind of the liquid crystal compound. When the treatment at such temperature is performed, the liquid crystal compound adopts a liquid crystal state, and the liquid crystal compound is aligned depending on the alignment treatment direction of the surface of the base material.

In one embodiment, the fixation of the alignment state is performed toy cooling the liquid crystal compound aligned as described above. When the liquid crystal compound is the polymerizable monomer or the cross-linkable monomer, the fixation of the alignment state is performed by subjecting the liquid crystal compound aligned as described above to polymerization treatment or cross-linking treatment.

Specific examples of the liquid crystal compound and details of the method of forming the alignment fixed layer are disclosed in Japanese Patent Application Laid-open No. 2006-163343. The disclosure of the laid-open publication is incorporated herein by reference.

A-4. Second Retardation Layer

As described above, the second retardation layer 40 can function as a λ/4 plate. According to the present invention, a circular polarization function in a wide wavelength range can be exhibited by correcting the wavelength dispersion characteristic of the second retardation layer functioning as a λ/4 plate with the optical characteristics of the first retardation layer functioning as a λ/2 plate. The in-plane retardation Re(550) of such second retardation layer is from 100 nm to 180 nm, preferably from 110 nm to 170 nm, more preferably from 120 nm to 160 nm. The second retardation layer 40 typically has a refractive index ellipsoid of nx>ny=nz. The Nz-coefficient of the second retardation layer is, for example, from 0.9 to 1.3.

The thickness of the second retardation layer can be set so that the layer may most appropriately function as a λ/4 plate. In other words, the thickness can be set so that a desired in-plane retardation may be obtained. Specifically, the thickness is preferably from 1 μm to 80 μm, more preferably from 10 μm to 60 μm, most preferably from 30 μm to 50 μm.

The second retardation layer 40 contains a resin having an absolute value of a photoelastic coefficient of preferably $2 \times 10^{-11}$ m$^2$/N or less, more preferably from $2.0 \times 10^{-13}$ m$^2$/N to $1.5 \times 10^{-11}$ m$^2$/N, still more preferably from $1.0 \times 10^{-12}$ m$^2$/N to $1.2 \times 10^{-11}$ m$^2$/N. When the absolute value of the photoelastic coefficient falls within such range, in the case where a shrinkage stress at the time of the heating of the layer occurs, a change in retardation hardly occurs. Therefore, when the second retardation layer is formed by using a resin having such absolute value of a photoelastic coefficient, in conjunction with the effects of the first retardation layer, the heat unevenness of the organic EL display apparatus to be obtained can be satisfactorily prevented. Further, in the present invention, the cracking of the circularly polarizing plate can be significantly prevented by a synergistic effect with the fact that the first retardation layer also has a small absolute value of a photoelastic coefficient as described above. As a result, the circularly polarizing plate of the present invention can be suitably used in an extremely thin organic EL display apparatus, and/or a bendable organic EL display apparatus.

The second retardation layer may show a reverse wavelength dispersion characteristic, i.e., a retardation value increasing with an increase in wavelength of measurement light, may show a positive wavelength dispersion characteristic, i.e., a retardation value decreasing with an increase in wavelength of measurement light, or may show a flat wavelength dispersion characteristic, i.e., a retardation value hardly changing even when the wavelength of measurement light changes. The layer preferably shows a flat wavelength dispersion characteristic. As described above, when the λ/2 plate (first retardation layer) and the λ/4 plate (second retardation layer) each having a flat wavelength dispersion characteristic are arranged at a predetermined axial angle, a characteristic close to an ideal reverse wavelength dispersion characteristic can be obtained, and as a result, an extremely excellent antireflection characteristic can be achieved. The second retardation layer preferably has a ratio Re(450)/Re(550) of from 0.39 to 1.03, and preferably has a ratio Re(650)/Re(550) of from 0.98 to 1.02.

The second retardation layer may include any appropriate resin film that can satisfy such optical characteristics and mechanical characteristics as described above. Typical examples of such resin include a cyclic olefin-based resin and a polycarbonate-based resin. Details about the cyclic olefin-based resin and the polycarbonate-based resin are as described in the section A-3.

The in-plane retardation Re of the second retardation layer can be controlled by changing the stretching ratio and stretching temperature of the cyclic olefin-based resin film or the polycarbonate-based resin film described in the section A-3. The stretching ratio may vary depending on, for example, a desired in-plane retardation value and thickness of the second retardation layer, the kind of the resin to be used, the thickness of the film to be used, and the stretching temperature. Specifically, the stretching ratio is preferably from 1.15 times to 4.00 times, more preferably from 1.25 times to 3.50 times, most preferably from 1.40 times to 3.00 times. When the film is stretched at such ratio, a second retardation layer having an in-plane retardation by which the effects of the present invention can foe appropriately exhibited can be obtained.

The stretching temperature may vary depending on, for example, the desired in-plane retardation value and thickness of the second retardation layer, the kind of the resin to be used, the thickness of the film to be used, and the stretching ratio. Specifically, the stretching temperature is preferably from Tg−30° C. to Tg+30° C., more preferably from Tg−15° C. to Tg+15° C., most preferably from Tg−10°

C. to Tg+10° C. When the film is stretched at such temperature, a second retardation layer having an in-plane retardation by which the effects of the present invention can be appropriately exhibited can be obtained.

The second retardation layer 40 is preferably a film obtained by laterally stretching the cyclic olefin-based resin film or the polycarbonate-based resin film. As described above, when the first retardation layer 30 has a slow axis in a predetermined direction, the second retardation layer can be produced by lateral stretching. As a result, the circularly polarizing plate can be produced by a roll-to-roll process. The lateral stretching can be performed with, for example, a tenter-type stretching machine.

The second retardation layer 40 may be formed of the same material as that for the first retardation layer 30, or may be formed of a material different from that for the first retardation layer. Further, the refractive index ellipsoid, Nz coefficient, and the like of the second retardation layer 40 may be identical to or different from those of the first retardation layer 30.

A-5. Third Retardation Layer

As described above, the refractive index characteristics of the third retardation layer show a relationship of nz>nx≥ny. When such third retardation layer is arranged, the function of the λ/4 plate (second retardation layer) can be sufficiently maintained even for light that has entered from an oblique direction, and as a result, an extremely excellent reflection hue in the oblique direction can be achieved. The thickness direction retardation Rth(550) of the third retardation layer is preferably from −260 nm to −10 nm, more preferably from −200 nm to −20 nm, still more preferably from −180 nm to −30 nm, particularly preferably from −180 nm to −60 nm.

In one embodiment, the refractive indices of the third retardation layer show a relationship of nx=ny. Herein, the term "nx=ny" encompasses not only the case where the nx and the ny are strictly equal to each other but also the case where the nx and the ny are substantially equal to each other. Specifically, the term means that the Re(550) of the layer is less than 10 nm. In another embodiment, the refractive indices of the third retardation layer show a relationship of nx>ny. In this case, the in-plane retardation Re(550) of the third retardation layer is preferably from 10 nm to 150 nm, more preferably from 10 nm to 80 nm. The refractive indices of the third retardation layer preferably show a relationship of nx>ny. This is because the use of such retardation layer can suitably compensate for a geometrical axial shift between the slow axes of the first retardation layer and the second retardation layer when viewed from an oblique direction, and hence can significantly improve an antireflection function in the oblique direction. As described above, in each of the case where the nx and the ny are substantially equal to each other, and the case where nx>ny, a slow axis can be expressed in the third retardation layer. In this case, when the third retardation layer is arranged between the polarizer and the λ/2 plate (first retardation layer), the layer can be laminated so that its slow axis may be perpendicular or parallel to the absorption axis of the polarizer. When the third retardation layer is arranged between the λ/2 plate (first retardation layer) and the λ/4 plate (second retardation layer), the layer can be laminated so that its slow axis may be in an oblique direction (e.g., a 45° direction) with regard to the absorption axis of the polarizer.

The third retardation layer may be formed of any appropriate material. The layer is preferably a liquid crystal layer fixed in homeotropic alignment. A liquid crystal material (liquid crystal compound) that can be subjected to homeotropic alignment may be a liquid crystal monomer or may be a liquid crystal polymer. Specific examples of the liquid crystal compound and a method of forming the liquid crystal layer include a liquid crystal compound and forming method described in paragraphs [0020] to [0042] of JP 2002-333642A. In this case, the thickness of the layer is preferably from 0.1 μm to 5 μm, more preferably from 0.2 μm to 3 μm. Even when the thickness of the liquid crystal layer is extremely small, desired optical characteristics are obtained. Accordingly, significant thinning of the circularly polarizing plate can be achieved.

As another preferred specific example, the third retardation layer may be a retardation film formed of a fumaric acid diester-based resin described in JP 2012-32784A. In this case, the thickness of the layer is preferably from 5 μm to 50 μm, more preferably from 10 μm to 35 μm. The retardation film formed of a fumaric acid diester-based resin has a wavelength dispersion characteristic close to flat dispersion, and hence has an advantage in that a change in hue is small.

A-6. Protective Film

The firsthand second protective films 21 and 22 are each formed of any appropriate film that may be used as a protective layer for the polarizer. Specific examples of a material serving as a main component of the film include transparent resins such as a cellulose-based resin such as triacetylcellulose (TAC), a polyester-based resin, a polyvinyl alcohol-based resin, a polycarbonate-based resin, a polyamide-based resin, a polyimide-based resin, a polyether sulfone-based resin, a polysulfone-based resin, a polystyrene-based resin, a polynorbornene-based resin, a polyolefin-based resin, a (meth)acrylic resin, and an acetate-based resin. Another example thereof is a thermosetting resin or a UV-curable resin such as a (meth)acrylic resin, a urethane-based resin, a (meth)acrylic urethane-faased resin, an epoxy-based resin, or a sllicone-based resin. Still another example thereof is a glassy polymer such as a siloxane-based polymer. Further, a polymer film described in JP 2001-343529 A (WO 01/37007 A1) may also be used. As a material for the film, for example, there may foe used a resin composition containing a thermoplastic resin having a substituted or unsubstituted imide group in a side chain and a thermoplastic resin having a substituted or unsubstituted phenyl group and a nit rile group in a side chain. An example thereof is a resin composition containing an alternate copolymer formed of isobutene and N-methylmaleimide and an acrylonitrile-styrene copolymer. The polymer film may be an extruded product of the resin composition, for example.

The glass transition temperature (Tg) of the (meth)acrylic resin is preferably 115° C. or more, more preferably 120° C. or more, still more preferably 125° C. or more, particularly preferably 130° C. or more because excellent durability can be obtained. An upper limit for the Tg of the (meth)acrylic resin is not particularly limited, and is preferably 170° C. or less from the viewpoint of formability or the like.

Any appropriate (meth)acrylic resin may be adopted as the (meth)acrylic resin as long as the effects of the present invention are not impaired. Examples of the (meth)acrylic resin include poly(meth)acrylates such as polymethyl methacrylate, a methyl methacrylate-(meth)acrylic acid copolymer, a methyl methacrylate-(meth)acrylate copolymer, a methyl methacrylate-acrylate-(meth)acrylic acid copolymer, a methyl (meth)acrylate-styrene copolymer (such as an MS resin), and a polymer having an alicyclic hydrocarbon group (such as a methyl metharylate-cyclohexyl methacrylate copolymer or a methyl methacrylate-norbornyl (meth)acrylate copolymer). Preferred examples thereof include poly ($C_{1-6}$ alkyl (meth)acrylates) such as polymethyl (meth)acrylate. A more preferred example thereof is a methyl methacrylate-based resin containing methyl methacrylate as a main component (from 50 to 100 wt %, preferably from 70 to 100 wt %).

Specific examples of the (meth)acrylic resin include ACRYPET VH and ACRYPET VRL20A manufactured by Mitsubishi Rayon Co., Ltd., a (meth)acrylic resin having a ring structure in the molecule described in JP 2004-70296 A, and a (meth)acrylic resin with a high Tg obtained by intramolecular cross-linking or an intramolecular cyclization reaction.

The (meth)acrylic resin is particularly preferably a (meth)acrylic resin having a lactone ring structure because of having high heat resistance, high transparency, and high mechanical strength.

Examples of the (meth)acrylic resin having a lactone ring structure include (meth)acrylic resins each having a lactone ring structure described in JP 2000-230016 A, JP 2001-151814 A, JP 2002-120326 A, JP 2002-254544 A, and JP 2005-146084 A.

The mass-average molecular weight (sometimes referred to as weight-average molecular weight) of the (meth)acrylic resin having a lactone ring structure is preferably from 1,000 to 2,000,000, more preferably from 5,000 to 1,000,000, still more preferably from 10,000 to 500,000, particularly preferably from 50,000 to 500,000.

The glass transition temperature (Tg) of the (meth)acrylic resin having a lactone ring structure is preferably 115° C. or more, more preferably 125° C. or more, still more preferably 130° C. or more, particularly preferably 135° C. or more, most preferably 140° C. or more because excellent durability can be obtained. An upper limit value for the Tg of the (meth)acrylic resin having a lactone ring structure is not particularly limited, and is preferably 170° C. or less from the viewpoint of formability or the like.

It should be noted that the term "(meth)acrylic" as used herein refers to acrylic and/or methacrylic.

The first protective film 21 to be arranged on an opposite side to the retardation layers with respect to the polarizer may be subjected to a surface treatment, such as a hard coat treatment, an antireflection treatment, a sticking prevention treatment, or an antiglare treatment, as required. The thickness of the first protective film is typically 5 mm or less, preferably 1 mm or less, more preferably from 1 µm to 500 µm, still more preferably from 5 µm to 150 µm.

It is preferred that the second protective film 22 arranged on the polarizer on the retardation layer side be optically isotropic. The phrase "optically isotropic" as used herein means that the in-plane retardation Re(550) of the film is from 0 nm to 10 nm and the thickness direction retardation Rth(550) thereof is from −10 nm to +10 nm.

The thickness of the second protective film is preferably from 5 µm to 200 µm, more preferably from 10 µm to 100 µm, still more preferably from 15 µm to 95 µm.

A-7. Others

Any appropriate pressure-sensitive adhesive layer or adhesive layer is used in the lamination of the respective layers for forming the circularly polarizing plate of the present invention. The pressure-sensitive adhesive layer is typically formed of an acrylic pressure-sensitive adhesive. The adhesive layer is typically formed of a polyvinyl alcohol-based adhesive. When the first retardation layer is an alignment fixed layer of a liquid crystal compound, and the alignment fixed layer is formed on the surface of the second protective film or the second retardation layer, the pressure-sensitive adhesive layer and the adhesive layer can be omitted.

Although not shown, a pressure-sensitive adhesive layer may be arranged on the surface of the outermost retardation layer of the circularly polarizing plate. When the pressure-sensitive adhesive layer is formed in advance, the circularly polarizing plate can be easily bonded to any other optical member (such as an organic EL display panel). A release film is preferably attached to the surface of the pressure-sensitive adhesive layer until the layer is used.

B. Organic EL Display Apparatus

An organic EL display apparatus of the present invention includes the circularly polarizing plate described in the section A on its viewer side. The circularly polarizing plate is laminated so that each of its retardation layers may be on an organic EL panel side (its polarizer may be on the viewer side).

EXAMPLES

Now, the present invention is specifically described by way of Examples. However, the present invention is not limited by these Examples. Methods of measuring characteristics are as described below.

(1) Thickness

Measurement was performed with a dial gauge (manufactured by PEACOCK, product name "DG-205", a dial gauge stand (product name "pds-2")).

(2) Retardation

A sample measuring 50 mm by 50 mm was cut out of each retardation layer, and measurement was performed by using the measurement sample and Axoscan manufactured by Axometrics. A measurement wavelength was 550 nm, and a measurement temperature was 23° C.

In addition, the average refractive index of the sample was measured with an Abbe refractometer manufactured by Atago Co., Ltd., and its refractive indices nx, ny, and nz were calculated from the resultant retardation value.

(3) Tint (Color Shift)

Whether or not the reflection hue of the resultant organic EL panel was satisfactory was visually observed. Evaluation criteria are as described below. In addition, the reflectance and line of reflected light were measured with a spectrophotometer 2600D (manufactured by Konica Minolta, Inc.). Values when a D65 light source was used were used. The distance of the measured hue xy from the hue xy of a neutral point was calculated as Δxy.

○ . . . The hue is neutral and the reflectance is low, and hence the hue and the reflectance are at satisfactory levels as the characteristics of an antireflection film.

Δ . . . The hue shifts from the neutral hue to some extent or the reflectance is somewhat high, but the characteristics of the panel are such levels that the circularly polarizing plate is usable as an antireflection film.

x . . . The hue largely shifts from the neutral hue and the reflectance is high, and hence the characteristics of the panel are such levels that the circularly polarizing plate is unusable as an antireflection film.

(4) Warping

The produced circularly polarizing plate was cut into a size measuring 113 mm by 66 mm so that the absorption axis of the polarizer was at 45° with regard to its long side. The circularly polarizing plate was bonded to a polyimide film measuring 120 mm by 72 mm, and the resultant laminate was heated in an oven at 85° C. for 120 hours. The laminate was taken out and cooled at room temperature, for 1 hour. After that, the laminate was placed on a flat table and the state of its warping (curling) was observed. Evaluation criteria are as described below.

○ . . . The laminate does not warp into a tubular shape.
Δ . . . The laminate warps into a tubular shape and the diameter of the tube is 40 mm or more.
× . . . The laminate warps into a tubular shape and the diameter of the tube is less than 40 mm.
(5) Productivity An evaluation was performed on the basis of whether or not a roll-to-roll process was able to be performed. Evaluation criteria are as described below.

○ . . . A circularly polarizing plate can be produced by the roll-to-roll process.
Δ . . . A circularly polarizing plate can be produced by the roll-to-roll process, but the width of a raw fabric narrows and hence productivity is somewhat poor.
× . . . A circularly polarizing plate cannot be produced by the roll-to-roll process.

Example 1

<Production of First Retardation Layer (λ/2 Plate)>

A roll-shaped unstretched film made of a norbornene-based resin having a photoelastic coefficient of $11\times10^{-12}$ m$^2$/N, a Tg of 125° C., and a thickness of 70 μm was obliquely stretched under an atmosphere at 133° C. The oblique stretching was continuously performed with a tenter-type stretching machine by making its left and right feeding speeds different from each other. As a result, a roll-shaped retardation film having a thickness of 45 μm was obtained. The in-plane retardation Re(550) of the retardation film was 270 nm, and the direction of its slow axis was a 22.5° direction with regard to the longitudinal direction of the film. The retardation film was used as a first retardation layer.

<Production of Second Retardation Layer (λ/4 Plate)>

A roll-shaped unstretched film made of a norbornene-based resin having a photoelastic coefficient of $11\times10^{-12}$ m$^2$/N, a Tg of 125° C., and a thickness of 50 μm was subjected to lateral uniaxial stretching at 1.526 times under an atmosphere at 128° C. to provide a roll-shaped retardation film having a thickness of 40 μm. The lateral uniaxial stretching was continuously performed with a tenter-type stretching machine. The in-plane retardation Re(550) of the retardation film was 1.40 nm, and the direction of its slow axis was a 90° direction with regard, to the longitudinal direction of the film. The retardation film was used as a second retardation layer.

<Production of Polarizer>

A polyvinyl alcohol film was dyed in an aqueous solution containing iodine, and was then uniaxially stretched at 6 times in an aqueous solution containing boric acid between rolls having different, speed ratios to provide a roll-shaped polarizer having an absorption axis in its longitudinal direction.

<Production of Circularly Polarizing Plate>

A triacetylcellulose film (thickness: 40 μm, manufactured by Konica Minolta, Inc., trade name: "KC4UYW") was bonded to one side of the polarizer through intermediation of a polyvinyl alcohol-based adhesive. The retardation film (first retardation layer) was bonded to the other side of the polarizer through intermediation of a polyvinyl alcohol-based adhesive. Next, the retardation film (second retardation layer) was bonded to the surface of the first retardation layer through intermediation of an acrylic pressure-sensitive adhesive. Any such bonding was performed by a roll-to-roll process. Thus, a roll-shaped circularly polarizing plate having a construction "protective film/polarizer/first retardation layer/second retardation layer" was obtained. In the resultant roll-shaped circularly polarizing plate, the absorption axis of the polarizer was in its longitudinal direction, an angle formed between the absorption axis of the polarizer and the slow axis of the first retardation layer was 22.5°, and an angle formed between, the absorption axis of the polarizer and the slow axis of the second retardation layer was 90°.

<Production of Organic EL Display Apparatus>

A pressure-sensitive adhesive layer was formed of an acrylic pressure-sensitive adhesive on the resultant circularly polarizing plate on the second retardation layer side, and the circularly polarizing plate was cut into dimensions measuring 50 mm by 50 mm.

An organic EL panel was taken out from an organic EL display (manufactured by Samsung Electronics Co., Ltd., product name: "Galaxy S4"). A polarizing film attached to the organic EL panel was peeled off, and the circularly polarizing plate obtained by the cutting was bonded instead. Thus, an organic EL display apparatus was obtained. The resultant organic EL display apparatus was subjected to the evaluation for a tint. The result is shown in Table 1.

Example 2

An optical alignment film was formed by application on the surface of the second retardation layer obtained in Example 1, and the resultant was subjected to an optical alignment treatment in a 22.5° direction with regard to its longitudinal direction. Meanwhile, a liquid crystal application liquid was prepared by dissolving 10 parts by weight of a polymerizable liquid crystal monomer showing a nematic liquid crystal phase (manufactured by BASF: trade name: "Paliocolor LC242") and 3 parts by weight of a photopolymerization initiator (manufactured by BASF: trade name: "IRGACURE 907") for the polymerizable liquid crystal monomer in 40 parts by weight of toluene. The application liquid was applied to the surface of the second retardation layer subjected to the optical alignment treatment with a bar coater, and then a liquid crystal was aligned by heating and drying the liquid at 80° C. for 4 minutes. The liquid crystal layer was cured by being irradiated with UV light, and hence a first retardation layer (thickness: 3 μm) was formed on the surface of the second retardation layer. Thus, a roll-shaped laminate of the first retardation layer having a slow axis in a 22.5° direction with regard to its longitudinal direction and the second retardation layer having a slow axis in a 90° direction with regard to its longitudinal direction was produced.

A circularly polarizing plate and an organic EL display apparatus were obtained in the same manner as in Example 1 except that the laminate obtained in the foregoing was used as the first retardation layer and the second retardation layer. In the resultant roll-shaped circularly polarizing plate, the absorption axis of the polarizer was in its longitudinal direction, an angle formed between the absorption axis of the polarizer and the slow axis of the first retardation layer was 22.5°, and an angle formed between the absorption axis of the polarizer and the slow axis of the second retardation layer was 90°. Further, the resultant organic EL display apparatus was subjected to the same evaluations as those of Example 1. The results are shown in Table 1.

Comparative Example 1

A roll-shaped unstretched film made of a norbornene-based resin having a photoelastic coefficient of $11\times10^{-12}$ m$^2$/N, a Tg of 125° C., and a thickness of 50 μm was subjected to longitudinal uniaxial stretching at 1.526 times under an atmosphere at 128° C. with rolls having different peripheral speeds to provide a roll-shaped retardation film having a thickness of 40 μm. The in-plane retardation Re(550) of the retardation film was 140 nm, and the direction of its slow axis was the longitudinal direction of the film. The retardation film was used as a second retardation layer.

A circularly polarizing plate and an organic EL display apparatus were obtained in the same manner as in Example 1 except that the second retardation layer obtained in the foregoing was used. In the resultant roll-shaped circularly polarizing plate, the absorption axis of the polarizer was in its longitudinal direction, an angle formed between the absorption axis of the polarizer and the slow axis of the first retardation layer was 22.5°, and an angle formed between the absorption axis of the polarizer and the slow axis of the second retardation layer was 0°. Further, the resultant, organic EL display apparatus was subjected to the same evaluations as those of Example 1. The results are shown in Table 1.

Comparative Example 2

A circularly polarizing plate and an organic EL display apparatus were obtained in the same manner as in Example 2 except that the second retardation layer of Comparative Example 1 was used. In the resultant roll-shaped circularly polarizing plate, the absorption axis of the polarizer was in its longitudinal direction, an angle formed between the absorption axis of the polarizer and the slow axis of the first retardation layer was 22.5°, and an angle formed between the absorption axis of the polarizer and the slow axis of the second retardation layer was 0°. Further, the resultant organic EL display apparatus was subjected to the same evaluations as those of Example 1. The results are shown in Table 1.

Comparative Example 3

Oblique stretching was attempted so that the direction of a slow axis in the same first retardation layer as that of Example 1 was a 15° direction with regard to its longitudinal direction. However, the slow axis could not be expressed in such direction. Further, oblique stretching was attempted so that the direction of a slow axis in the same second retardation layer as that of Example 1 was a 75° direction with regard to its longitudinal direction. However, the slow axis could not be expressed in such direction.

In view of the foregoing results, the same unstretched films as that of Example 1 were each subjected to longitudinal uniaxial stretching between rolls having different peripheral speeds. Thus, a first retardation layer and a second retardation layer having slow axes in their longitudinal directions were obtained. Here, stretching conditions and thicknesses were adjusted so that the in-plane retardation Re(550) of each of the first retardation layer and the second retardation layer became the same as that of Example 1. Each of the first retardation layer and the second retardation layer was cut in an oblique direction with regard to the longitudinal direction, and the layers were laminated together with a polarizer and a protective film. Thus, a sheet-type circularly polarizing plate having a construction "protective film/polarizer/first retardation layer/second retardation layer" was obtained. In the resultant circularly polarizing plate, an angle formed between the absorption axis of the polarizer and the slow axis of the first retardation layer was 15°, and an angle formed between the absorption axis of the polarizer and the slow axis of the second retardation layer was 75°. An organic EL display apparatus was obtained in the same manner as in Example 1 except that the above-described circularly polarizing plate was used. The resultant, organic EL display apparatus was subjected to the same evaluations as those of Example 1. The results are shown in Table 1.

Comparative Example 4

A first retardation layer was obtained in the same manner as in Example 2 except that the direction of the optical alignment treatment was changed to a 15° direction with regard to the longitudinal direction. Meanwhile, oblique stretching was attempted so that the direction of a slow axis in the same second retardation layer as that of Example 1 was a 75° direction with regard to its longitudinal direction. However, the slow axis could not be expressed in such direction.

In view of the foregoing results, the same unstretched film as that of Example 1 was subjected to longitudinal uniaxial stretching between rolls having different peripheral speeds. Thus, a second retardation layer having a slow axis in its longitudinal direction was obtained. The subsequent procedure was in conformity with that of Comparative Example 3. Thus, a sheet-type circularly polarizing plate having a construction "protective film/polarizer/first retardation layer/second retardation layer" was obtained. In the resultant circularly polarizing plate, an angle formed between the absorption axis of the polarizer and the slow axis of the first retardation layer was 15°, and an angle formed between the absorption axis of the polarizer and the slow axis of the second retardation layer was 75°. The resultant organic EL display apparatus was subjected to the same evaluations as those of Example 1. The results are shown in Table 1.

TABLE 1

| | Axial direction | | | | Productivity (roll-to-roll) | Warping |
|---|---|---|---|---|---|---|
| | Polarizer | First retardation layer | Second retardation layer | Tint | | |
| Example 1 | 0° | 22.5° | 90° | ○ | ○ | ○ |
| Example 2 | 0° | 22.5° | 90° | ○ – Δ | ○ | ○ |
| Comparative Example 1 | 0° | 22.5° | 0° | x | Δ | x |
| Comparative Example 2 | 0° | 22.5° | 0° | x | Δ | x |
| Comparative Example 3 | 0° | 15° | 75° | ○ | x | Δ |
| Comparative Example 4 | 0° | 15° | 75° | ○ | x | Δ |

<Evaluation>

As is apparent from Table 1, the circularly polarizing plate of each of Examples of the present invention was able to be produced by the roll-to-roll process, was excellent in productivity, and did not warp. Further, the organic EL display apparatus using the circularly polarizing plate of each of Examples of the present invention was excellent in tint. Remarkable warping occurred in the circularly polarizing plate of each of Comparative Examples 1 and 2 in which the direction of the absorption axis of the polarizer and the direction of the slow axis of the second retardation layer were parallel to each other. In addition, in each of Comparative Examples 1 and 2, the roll-to-roll process was able to be performed, but it was difficult to produce a wide circularly polarizing plate. Further, the organic EL display apparatus using the circularly polarizing plate of each of Comparative Examples 1 and 2 showed an undesired tint. It was impossible to produce the circularly polarizing plate of each of Comparative Examples 3 and 4 corresponding to a conventional construction by the roll-to-roll process. Further, the circularly polarizing plate of each of Comparative Examples 3 and 4 produced by the cutting was observed to warp.

INDUSTRIAL APPLICABILITY

The circularly polarizing plate of the present invention is suitably used in an organic EL display apparatus.

REFERENCE SIGNS LIST 10 polarizer
21 first protective film
22 second protective film
30 first retardation layer (λ/2 plate)
40 second retardation layer (λ/4 plate)
100 circularly polarizing plate

The invention claimed is:

1. An elongated circularly polarizing plate for an organic EL display apparatus, comprising in the following order:
   an elongated polarizer having an absorption axis in a longitudinal direction thereof;
   an elongated first retardation layer functioning as a λ/2 plate; and
   an elongated second retardation layer functioning as a λ/4 plate,
   wherein:
   an angle formed between the absorption axis of the elongated polarizer and a slow axis of the elongated first retardation layer is from 15° to 30°;
   the absorption axis of the elongated polarizer and a slow axis of the elongated second retardation layer are substantially perpendicular to each other;
   the elongated first retardation layer comprises an obliquely stretched resin film;
   the elongated first retardation layer has a slow axis in a direction at an angle from 15° to 30° with respect to a longitudinal direction of the elongated first retardation layer, and
   a laminate of the elongated first retardation layer and the elongated second retardation layer has a ratio Re(450)/Re(550) of from 0.86 to 0.96, and has a ratio Re(650)/Re(550) of from 1.03 to 1.10.

2. The elongated circularly polarizing plate for an organic EL display apparatus according to claim 1, wherein the elongated polarizer, the elongated first retardation layer, and the elongated second retardation layer are laminated by being continuously bonded to one another with their respective longitudinal directions aligned with one another while being conveyed in the longitudinal directions.

3. The elongated circularly polarizing plate for an organic EL display apparatus according to claim 2, wherein:
   the obliquely stretched resin film is an obliquely stretched film of a cyclic olefin-based resin, or an obliquely stretched film of a polycarbonate-based resin; and
   the elongated second retardation layer comprises a laterally stretched film of a cyclic olefin-based resin or a laterally stretched film of a polycarbonate-based resin.

4. The elongated circularly polarizing plate for an organic EL display apparatus according to claim 2, further comprising, between the elongated polarizer and the elongated first retardation layer, between the elongated first retardation layer and the elongated second retardation layer, or on a side of the elongated second retardation layer opposite to the elongated first retardation layer, a third retardation layer having a refractive index ellipsoid of nz>nx=ny.

5. An organic EL display apparatus, comprising the elongated circularly polarizing plate for an organic EL display apparatus of claim 2.

6. The elongated circularly polarizing plate for an organic EL display apparatus according to claim 1, wherein:
   the obliquely stretched resin film is an obliquely stretched film of a cyclic olefin-based resin, or an obliquely stretched film of a polycarbonate-based resin; and
   the elongated second retardation layer comprises a laterally stretched film of a cyclic olefin-based resin or a laterally stretched film of a polycarbonate-based resin.

7. The elongated circularly polarizing plate for an organic EL display apparatus according to claim 6, further comprising, between the elongated polarizer and the elongated first retardation layer, between the elongated first retardation layer and the elongated second retardation layer, or on a side of the elongated second retardation layer opposite to the elongated first retardation layer, a third retardation layer having a refractive index ellipsoid of nz>nx=ny.

8. An organic EL display apparatus, comprising the elongated circularly polarizing plate for an organic EL display apparatus of claim 6.

9. The elongated circularly polarizing plate for an organic EL display apparatus according to claim 1, further comprising, between the elongated polarizer and the elongated first retardation layer, between the elongated first retardation layer and the elongated second retardation layer, or on a side of the elongated second retardation layer opposite to the elongated first retardation layer, a third retardation layer having a refractive index ellipsoid of nz>nx=ny.

10. An organic EL display apparatus, comprising the elongated circularly polarizing plate for an organic EL display apparatus of claim 9.

11. An organic EL display apparatus, comprising the elongated circularly polarizing plate for an organic EL display apparatus of claim 1.

* * * * *